United States Patent
Jang et al.

(10) Patent No.: US 10,553,827 B2
(45) Date of Patent: Feb. 4, 2020

(54) DISPLAY DEVICE

(71) Applicant: Samsung Display Co., Ltd., Yongin-Si, Gyeonggi-Do (KR)

(72) Inventors: Mi Jang, Seongnam-si (KR); Ivan Maidanchuk, Hwaseong-si (KR); Dohyun Kwon, Seongnam-si (KR); Minjung Lee, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/164,729

(22) Filed: Oct. 18, 2018

(65) Prior Publication Data

US 2019/0221779 A1   Jul. 18, 2019

(30) Foreign Application Priority Data

Jan. 12, 2018  (KR) .................... 10-2018-0004298

(51) Int. Cl.
*H01L 51/52* (2006.01)
*G06F 3/041* (2006.01)
*H01L 27/32* (2006.01)

(52) U.S. Cl.
CPC ........ *H01L 51/5275* (2013.01); *G06F 3/0412* (2013.01); *H01L 27/322* (2013.01); *H01L 27/323* (2013.01); *H01L 27/3246* (2013.01); *H01L 27/3272* (2013.01); *H01L 51/5253* (2013.01)

(58) Field of Classification Search
CPC ............... H01L 27/323; H01L 27/3272; H01L 51/5253; H01L 51/5275; H01L 27/3246; H01L 51/5284; H01L 27/322; G06F 3/0412; G06F 3/044
See application file for complete search history.

(56) References Cited

U.S. PATENT DOCUMENTS

| 8,963,138 B2 | 2/2015 | Lim et al. |
| 2010/0059754 A1 | 3/2010 | Lee et al. |
| 2014/0027725 A1 | 1/2014 | Lim et al. |
| 2014/0339509 A1 | 11/2014 | Choi et al. |

(Continued)

FOREIGN PATENT DOCUMENTS

| KR | 10-0656082 B1 | 12/2006 |
| KR | 10-2010-0030865 A | 3/2010 |
| KR | 10-2014-0014685 A | 2/2014 |

OTHER PUBLICATIONS

Extended European Search Report, Application No. 19150927.2, dated May 8, 2019, 8 pages.

*Primary Examiner* — Muhammad N Edun
(74) *Attorney, Agent, or Firm* — Innovation Counsel LLP

(57) ABSTRACT

A display device has excellent luminous efficiency, the display device including: a display portion including pixels defined by a pixel defining layer; and a touch portion on the display portion. The touch portion includes: a first touch electrode overlapping the pixel defining layer; a first organic layer on the first touch electrode; a second touch electrode contacting the first touch electrode; a second organic layer on the second touch electrode; and a high refractive index layer on the first organic layer, the second touch electrode, and the second organic layer. The high refractive index layer is disposed between adjacent second touch electrodes in a plan view and includes a first convex surface protruding toward the display portion and overlapping one of the pixels.

20 Claims, 11 Drawing Sheets

(56) References Cited

U.S. PATENT DOCUMENTS

| | | | |
|---|---|---|---|
| 2015/0311477 A1* | 10/2015 | Cho | .................... H01L 51/5284 |
| | | | 257/40 |
| 2015/0333108 A1 | 11/2015 | Miyamto et al. | |
| 2016/0093823 A1* | 3/2016 | Seo | .................... H01L 51/5016 |
| | | | 257/40 |
| 2017/0090634 A1 | 3/2017 | Yang et al. | |
| 2017/0271610 A1* | 9/2017 | Takahashi | ........... H01L 51/5012 |
| 2017/0338288 A1 | 11/2017 | Lee et al. | |

\* cited by examiner

DISPLAY DEVICE

CROSS-REFERENCE TO RELATED APPLICATION

This application claims priority under 35 U.S.C. § 119 to Korean Patent Application No. 10-2018-0004298, filed on Jan. 12, 2018, in the Korean Intellectual Property Office (KIPO), the disclosure of which is incorporated by reference herein in its entirety.

1. TECHNICAL FIELD

Embodiments of the present inventive concept relate to a display device, and more particularly, to a display device having excellent luminous efficiency.

2. DISCUSSION OF RELATED ART

Organic light emitting diode ("OLED") display devices are a self-luminous display device that displays images using an OLED that emits light. The OLED display devices are attracting attention because they have characteristics such as low power consumption, high luminance and high respond speed. Such an OLED display device has a multi-layer structure including an OLED. Each layer included in the OLED display device includes different materials, and has different refractive indices. Since each layer has different refractive indices as described above, reflection or total reflection of light occurs at an interlayer interface. Because a part of the light generated in the OLED is extinguished by such light reflection or total reflection, the OLED display device has low luminous efficiency. Accordingly, it is necessary to increase the luminous efficiency of the OLED display device.

It is to be understood that this background of the technology portion is intended to provide useful background for understanding the technology and as such disclosed herein, the technology background portion may include ideas, concepts or recognitions that were not part of what was known or appreciated by those skilled in the pertinent art prior to a corresponding effective filing date of subject matter disclosed herein.

SUMMARY

Embodiments of the present inventive concept may be directed to a display device having excellent luminous efficiency.

According to an embodiment, a display device includes: a display portion including pixels defined by a pixel defining layer; and a touch portion on the display portion. The touch portion includes: a first touch electrode overlapping the pixel defining layer; a first organic layer on the first touch electrode; a second touch electrode contacting the first touch electrode; a second organic layer on the second touch electrode; and a high refractive index layer on the first organic layer, the second touch electrode, and the second organic layer. The high refractive index layer is disposed between adjacent second touch electrodes in a plan view and comprises a first convex surface protruding toward the display portion and overlapping one of the pixels.

The first organic layer may have a refractive index substantially equal to a refractive index of the second organic layer. The high refractive index layer may have a refractive index higher than a refractive index of the first organic layer.

The first convex surface may contact at least one of the first organic layer and the second organic layer.

The touch portion further may include a third organic layer disposed on the high refractive index layer and having a refractive index substantially equal to a refractive index of the first organic layer and the second organic layer.

The high refractive index layer may be disposed between the second touch electrodes in a plan view and include a second convex surface protruding toward the third organic layer.

The second convex surface may contact the third organic layer.

The second convex surface may overlap the first convex surface in a plan view.

The touch portion further may include a substrate and an adhesive layer, the adhesive layer being disposed between the substrate and the third organic layer.

The display portion may include: a first pixel electrode; a light emitting layer on the first pixel electrode; and a second pixel electrode on the light emitting layer.

The high refractive index layer may be a color filter having a color substantially the same as a color of a light emitted from the light emitting layer.

The high refractive index layer may be a color filter having one color of red, green, and blue.

The first convex surface of the high refractive index layer may overlap the light emitting layer.

The first touch electrode and the second touch electrode may overlap the pixel defining layer.

The touch portion may further include a light blocking portion on the second organic layer, the light blocking portion overlapping the pixel defining layer.

The display portion may further include a thin film encapsulation layer on the second pixel electrode and the pixel defining layer.

The display portion may further include an inorganic layer between the touch portion and the thin film encapsulation layer.

According to an embodiment, a display device includes: a display portion including a pixel area defined by a plurality of pixel defining layers; and a touch portion on the display portion. The touch portion includes: a first touch electrode overlapping the pixel defining layer; a first organic layer on the first touch electrode; a second touch electrode on the first organic layer; a second organic layer on the second touch electrode; a high refractive index layer on the first organic layer, the second touch electrode, and the second organic layer; and a third organic layer disposed on the high refractive index layer and having a refractive index substantially equal to a refractive index of the first organic layer and the second organic layer. The high refractive index layer is disposed between adjacent second touch electrodes in a plan view and comprises a first convex surface protruding toward the third organic layer and overlapping the pixel area. The high refractive index layer has a refractive index higher than a refractive index of the first, second, and third organic layers.

The first convex surface may contact the third organic layer.

According to an embodiment, a display device includes: a display portion including a pixel area defined by a plurality of pixel defining layers; and a touch portion on the display portion. The touch portion includes: a first touch electrode overlapping the pixel defining layer; a first organic layer on the first touch electrode; a second touch electrode on the first organic layer; a second organic layer on the second touch electrode; a high refractive index layer on the first organic layer, the second touch electrode, and the second organic layer; and a third organic layer on the high refractive index layer. The high refractive index layer is disposed between adjacent second touch electrodes in a plan view and comprises a first concave surface having a lens shape and overlapping the pixel area. The high refractive index layer has a refractive index higher than a refractive index of the first, second, and third organic layers.

The first concave surface may contact the third organic layer.

The foregoing is illustrative only and is not intended to be in any way limiting. In addition to the illustrative aspects, embodiments and features described above, further aspects, embodiments and features will become apparent by reference to the drawings and the following detailed description.

BRIEF DESCRIPTION OF THE DRAWINGS

A more complete appreciation of the present inventive concept will become more apparent by describing in detail embodiments thereof with reference to the accompanying drawings, wherein.

DETAILED DESCRIPTION

Figure 1:
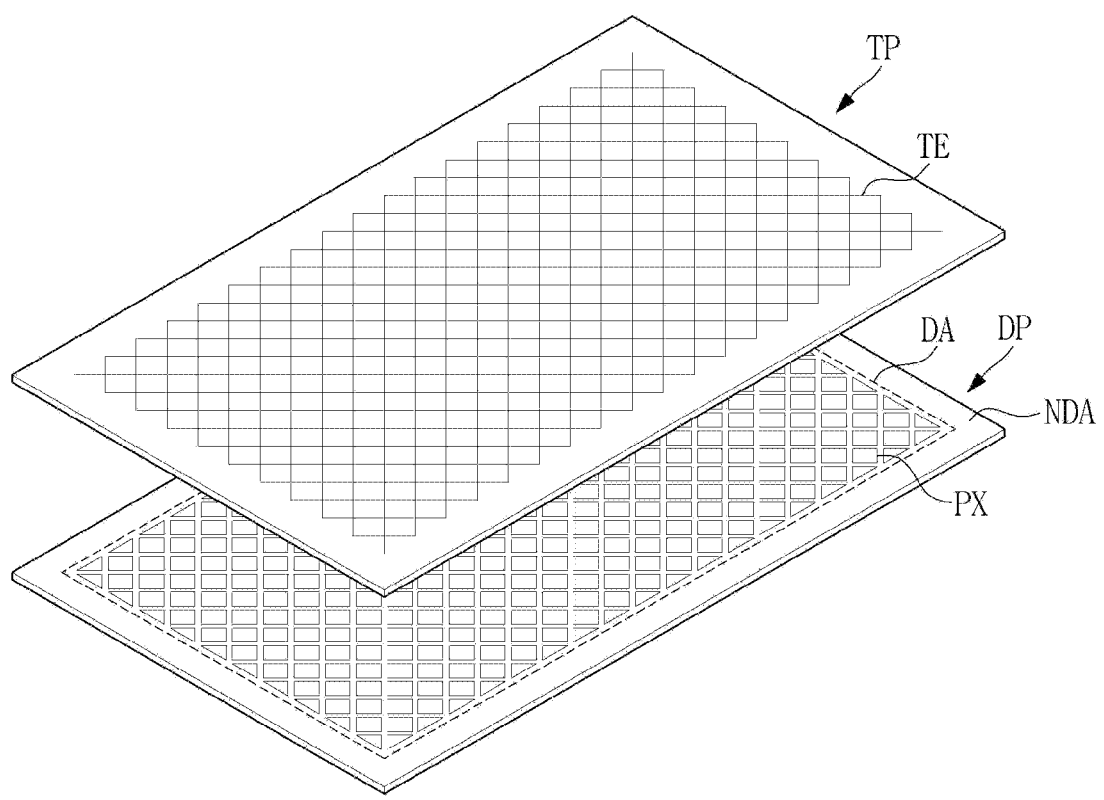
FIG. 1 is a perspective view illustrating a display device according to an embodiment of the present inventive concept.

Embodiments will now be described more fully hereinafter with reference to the accompanying drawings. Although the inventive concept may be modified in various manners and have several embodiments, embodiments are illustrated in the accompanying drawings and will be mainly described in the specification. However, the scope of the inventive concept is not limited to the embodiments and should be construed as including all the changes, equivalents and substitutions included in the spirit and scope of the inventive concept.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "including," "includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of variation for the particular value as determined by one of ordinary skill in the art, considering the measurement in question and the error associated with measurement of the particular quantity (i.e., the limitations of the measurement system). For example, "about" may mean within one or more standard variations, or within ±30%, 20%, 10%, 5% of the stated value.

Unless otherwise defined, all terms used herein (including technical and scientific terms) have the same meaning as commonly understood by those skilled in the art to which this inventive concept pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to For example describe embodiments of the present inventive concept and like reference numerals refer to like elements throughout the specification.

Hereinafter, a display device according to an embodiment of the present inventive concept will be described with reference to FIGS. 1 to 8.

FIG. 1 is a perspective view illustrating a display device according to an embodiment of the present inventive concept.

Referring to FIG. 1, a display device according to an embodiment of the present inventive concept includes a display portion DP and a touch portion TP. According to an embodiment of the present inventive concept, the display portion DP and the touch portion TP are unitarily formed. However, embodiments are not limited thereto, and the display portion DP and the touch portion TP may be formed as separate components.

The display portion DP includes a display area DA and a non-display area NDA, and a plurality of pixels PX are located in the display area DA.

The touch portion TP is disposed on the display portion DP and includes a touch electrode TE.

Hereinafter, a display portion according to an embodiment of the present inventive concept will be described in detail with reference to FIGS. 2 and 3.

Figure 2:
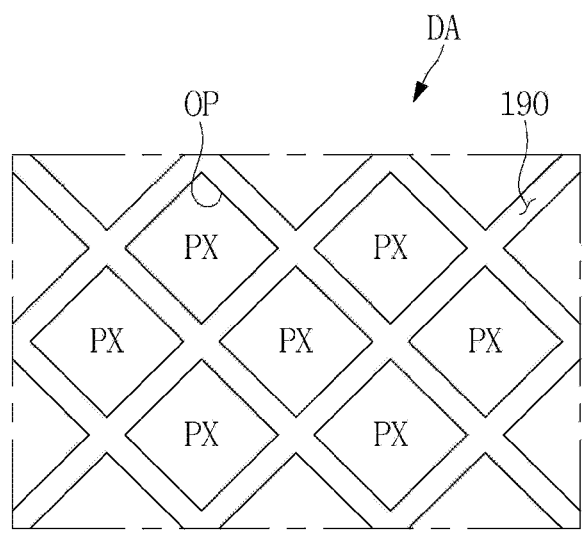
FIG. 2 is a plan view illustrating a part of a display portion according to an embodiment of the present inventive concept.
Figure 3:
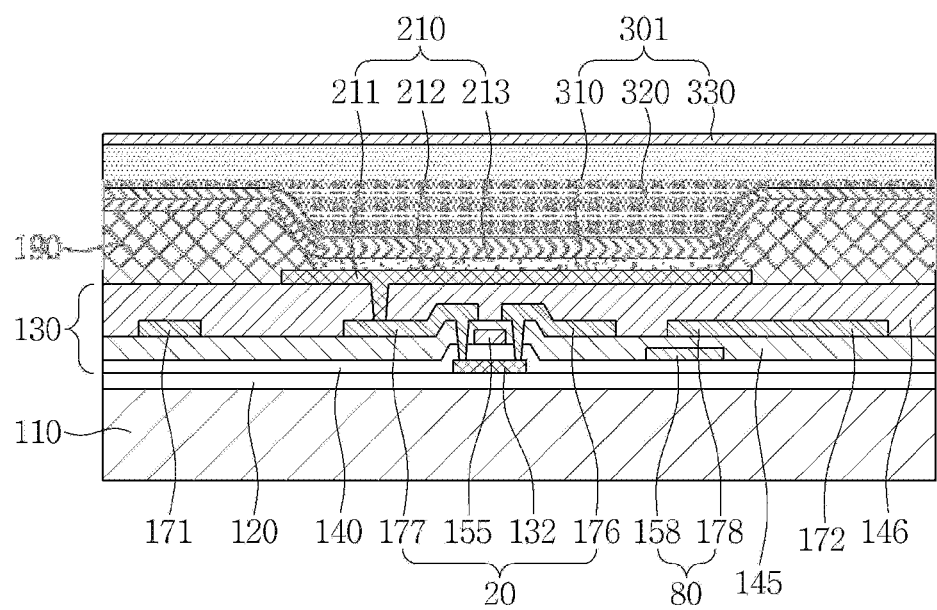
FIG. 3 is a cross-sectional view illustrating a part of a display portion according to an embodiment of the present inventive concept.

FIG. 2 is a plan view illustrating a part of a display portion according to an embodiment of the present inventive concept, and FIG. 3 is a cross-sectional view illustrating a part of a display portion according to an embodiment of the present inventive concept.

Referring to FIGS. 2 and 3, the display portion DP according to an embodiment of the present inventive concept includes the plurality of pixels PX defined by a pixel defining layer 190, and each pixel PX includes a first substrate 110, a wiring portion 130, an organic light emitting element (hereinafter, "organic light emitting diode (OLED)") 210, and a thin film encapsulation layer 301.

The first substrate 110 may include an insulating material of; glass, quartz, ceramic, plastic, or the like. However, embodiments are not limited thereto, and the first substrate 110 according to an embodiment may include a metallic material such as stainless steel.

A buffer layer 120 is disposed on the first substrate 110. The buffer layer 120 may include one or more layers selected from various inorganic layers and organic layers. The buffer layer 120 serves to substantially prevent permeation of undesirable elements such as impurities or moisture into the wiring portion 130 or the OLED 210 and to planarize a surface therebelow. However, the buffer layer 120 is not invariably necessary and may be omitted.

The wiring portion 130 is disposed on the buffer layer 120. The wiring portion 130 corresponds to a portion including a switching thin film transistor ("TFT"), a driving TFT 20, and a capacitor 80. The wiring portion 130 drives the OLED 210. The OLED 210 emits light according to the driving signal received from the wiring portion 130 to display images.

The display device according to an embodiment of the present inventive concept may be an active matrix-type organic light emitting diode ("AMOLED") display device having a 2Tr-1Cap structure. For example, the 2Tr-1Cap structure may include two TFTs, e.g., the switching TFT (not illustrated) and the driving TFT 20, and one capacitor 80 in each pixel PX, but embodiments are not limited thereto. For example, the display device may include three or more TFTs and two or more capacitors in each pixel, and may further include additional wirings. Herein, the term "pixel" refers to a smallest unit for displaying a specific color, and the display device displays images using a plurality of pixels.

The switching TFT (not illustrated), the driving TFT 20, the capacitor 80, and the OLED 210 are provided in each pixel PX. In addition, a gate line (not illustrated) disposed along one direction, and a data line 171 and a common power line (not illustrated) insulated from and intersecting the gate line are disposed in the wiring portion 130.

The capacitor 80 includes a pair of capacitor plates 158 and 178 with an insulating interlayer 145 interposed therebetween. In such an embodiment, the insulating interlayer 145 may be a dielectric element. A capacitance of the capacitor 80 is determined by electric charges accumulated in the capacitor 80 and a voltage between the pair of capacitor plates 158 and 178.

The switching TFT includes a switching semiconductor layer, a switching gate electrode, a switching source electrode and a switching drain electrode. The driving TFT 20 includes a driving semiconductor layer 132, a driving gate electrode 155, a driving source electrode 176 and a driving drain electrode 177. The semiconductor layer 132 and the gate electrode 155 are insulated by the gate insulating layer 140.

The switching TFT may function as a switching element which selects a pixel to transmit a data voltage applied to the data line 171 to the driving TFT 20. The switching gate electrode is connected to the gate line, and the switching source electrode is connected to the data line 171. Spaced apart from the switching source electrode, the switching drain electrode is connected to one of the capacitor plates, e.g., the capacitor plate 158.

Although not illustrated, the driving TFT 20 applies, to a first pixel electrode 211, a driving power which allows the light emitting layer 212 of the OLED 210 in the selected pixel to emit light. The driving gate electrode 155 is connected to the one capacitor plate 158 that is connected to the switching drain electrode. Each of the driving source electrode 176 and the other of the capacitor plates, e.g., the capacitor plate 178, is connected to the common power line. The driving drain electrode 177 is connected to the first pixel electrode 211, which is a pixel electrode, of the OLED 210 through a contact hole.

The switching TFT is driven based on a gate voltage applied to the gate line and serves to transmit a data voltage applied to the data line 171 to the driving TFT 20. A voltage equivalent to a difference between a common voltage applied to the driving TFT 20 from the common power line and the data voltage transmitted by (or from) the switching TFT is stored in the capacitor 80, and a current corresponding to the voltage stored in the capacitor 80 flows to the OLED 210 through the driving TFT 20 such that the OLED 210 may emit light.

A planarizing layer 146 is disposed on the insulating interlayer 145. The planarizing layer 146 includes an insulating material and protects the wiring portion 130. The planarizing layer 146 and the insulating interlayer 145 may include a substantially same material.

The OLED 210 is disposed on the planarizing layer 146. The OLED 210 includes the first pixel electrode 211, the light emitting layer 212 disposed on the first pixel electrode 211, and a second pixel electrode 213 disposed on the light emitting layer 212. Holes and electrons are injected into the light emitting layer 212 from the first pixel electrode 211 and the second pixel electrode 213, respectively, and combined with each other to form an exciton. When the excitons fall from the excited state to the ground state, light emission occurs.

In an embodiment, the first pixel electrode 211 is an anode for injecting holes, and the second electrode 213 is a cathode for injecting electrons. However, embodiments are not limited thereto, and the first pixel electrode 211 may be a cathode, and the second electrode 213 may be an anode.

According to an embodiment, the first pixel electrode 211 may include a reflective layer and the second electrode 213 may include a transflective layer. Accordingly, a light generated in the light emitting layer 212 is emitted through the second electrode 213. That is, the display device according to an embodiment of the present inventive concept may have a top emission type structure. However, embodiments are not limited thereto.

The first pixel electrode 211 may have a structure in which, for example, a reflective layer and a transparent conductive layer are stacked. In such an embodiment, the transparent conductive layer of the first pixel electrode 211 is disposed between the reflective layer and the light emitting layer 212.

The reflective layer may include one or more metals of: magnesium (Mg), silver (Ag), gold (Au), calcium (Ca), lithium (Li), chromium (Cr), copper (Cu) and aluminum (Al).

The transparent conductive layer may include transparent conductive oxide (TCO). Examples of the TCO may include: indium tin oxide (ITO), indium zinc oxide (IZO), zinc oxide (ZnO), aluminum zinc oxide (AZO) or indium oxide ($In_2O_3$). Since such a transparent conductive layer has a high work function, hole injection through the first pixel electrode 211 is smooth.

In addition, the first pixel electrode 211 may have a triple-layer structure in which a transparent conductive layer, a reflective layer and a transparent conductive layer are sequentially stacked. The first pixel electrode 211 may only include a transparent conductive layer. In such an embodiment, the first pixel electrode 211 becomes a transparent electrode.

The second electrode 213 may include a transflective layer including one or more metals of: magnesium (Mg), silver (Ag), gold (Au), calcium (Ca), lithium (Li), chromium (Cr), copper (Cu) and aluminum (Al). In general, the transflective layer may have a thickness of about 200 nm or less. As the thickness of the transflective layer becomes thinner, the transmittance of light becomes higher, and as the thickness thereof becomes thicker, the transmittance of light becomes lower.

At least one of a hole injection layer HIL and a hole transport layer HTL may further be provided between the first pixel electrode 211 and the light emitting layer 212 (not illustrated).

In addition, at least one of an electron transport layer ETL and an electron injection layer EIL may further be provided between the light emitting layer 212 and the second pixel electrode 213 (not illustrated).

The light emitting layer 212, the hole injection layer HIL, the hole transport layer HTL, the electron transport layer ETL, and the electron injection layer EIL may be referred to as an organic layer. The organic layer may include a low molecular organic material or a high molecular organic material.

The pixel defining layer 190 has an opening OP. The opening OP of the pixel defining layer 190 exposes a portion of the first pixel electrode 211.

For example, the pixel defining layer 190 is disposed on the first substrate 110 and overlaps an edge of the first pixel electrode 211. The opening OP of the pixel defining layer 190 is defined by a side wall. At least a part of the first pixel electrode 211 is exposed from the pixel defining layer 190 by the opening OP.

The first pixel electrode 211, the light emitting layer 212, and the second pixel electrode 213 are sequentially stacked at the opening OP of the pixel defining layer 190. The second pixel electrode 213 is formed on the pixel defining layer 190 as well as on the light emitting layer 212. In an embodiment, the hole injection layer HIL, the hole transport layer HTL, the electron transport layer ETL, and the electron injection layer EIL may also be disposed between the pixel defining layer 190 and the second pixel electrode 213. The OLED 210 generates light from the light emitting layer 212 located at the opening OP of the pixel defining layer 190. In such a manner, the pixel defining layer 190 may define the pixel PX.

The thin film encapsulation layer 301 is disposed on the second pixel electrode 213 to protect the OLED 210. The thin film encapsulation layer 301 substantially prevents outside air such as moisture or oxygen from permeating into the OLED 210.

The thin film encapsulation layer 301 includes at least one inorganic layer 310 and 330 and at least one organic layer 320 which are alternately disposed.

In FIG. 3, the thin film encapsulation layer 301 includes two inorganic layers 310 and 330 and one organic layer 320, but embodiments are not limited thereto.

Each of the inorganic layers 310 and 330 may include one or more inorganic materials of: $Al_2O_3$, $TiO_2$, $ZrO$, $SiO_2$, AlON, AlN, SiON, $Si_3N_4$, ZnO and $Ta_2O_5$. The inorganic layers 310 and 330 may be formed through methods such as a chemical vapor deposition (CVD) method or an atomic layer deposition (ALD) method. However, embodiments are not limited thereto, and the inorganic layers 310 and 330 may be formed using various methods known to those skilled in the art.

The organic layer 320 may include a polymer-based material. Examples of the polymer-based material may include, for example, an acrylic resin, an epoxy resin, polyimide, and polyethylene. In addition, the organic layer 320 may be formed through a thermal deposition process. The thermal deposition process for forming the organic layers 320 may be performed in a temperature range that may not damage the OLED 210. However, embodiments are not limited thereto, and the organic layer 320 may be formed using various methods known to those skilled in the pertinent art.

The inorganic layers 310 and 330 which have a high density of thin layer may prevent or efficiently reduce infiltration of, mostly, moisture or oxygen. Permeation of moisture and oxygen into the OLED 210 may be largely prevented by the inorganic layers 310 and 330.

The moisture and oxygen that have passed through the inorganic layers 310 and 330 are blocked again by the organic layer 320. The organic layer 320 has a smaller effect of preventing moisture permeation than the inorganic layers 310 and 330. However, the organic layers 320 may also serve as a buffer layer to reduce stress among respective ones of the inorganic layers 310 and 330, in addition to the moisture-permeation preventing function. In addition, since the organic layer 320 has planarizing characteristics, an uppermost surface of the thin film encapsulation layer 301 may be planarized.

The thin film encapsulation layer 301 may have a thickness of about 50 μm or less, or may have a thickness of about 10 μm or less as necessary. Accordingly, the display device may have a significantly small thickness.

Although not illustrated, a sealing substrate may be disposed on the thin film encapsulation layer 301 to protect the OLED 210. The sealing substrate opposes the first substrate 110 to be coupled to thereto and protects the OLED 210. As the sealing substrate, a transparent insulating substrate including glass, quartz, ceramics, plastic, or the like may be used. The sealing substrate may be omitted. When the sealing substrate is omitted, the flexible properties of the display device may become excellent.

Although not illustrated, the display device may further include a capping layer disposed between the OLED 210 and the thin film encapsulation layer 301. The capping layer has light transmittance and serves to protect the OLED 210. The capping layer may serve a light emitted from the light emitting layer 212 to be efficiently emitted to the outside.

In addition, although not illustrated, an inorganic layer may be disposed on the thin film encapsulation layer 301. The inorganic layer has light transmittance and may protect the OLED 210.

Hereinafter, a touch portion according to an embodiment of the present inventive concept will be described in detail with reference to FIGS. 4A to 8.

Figure 4A:
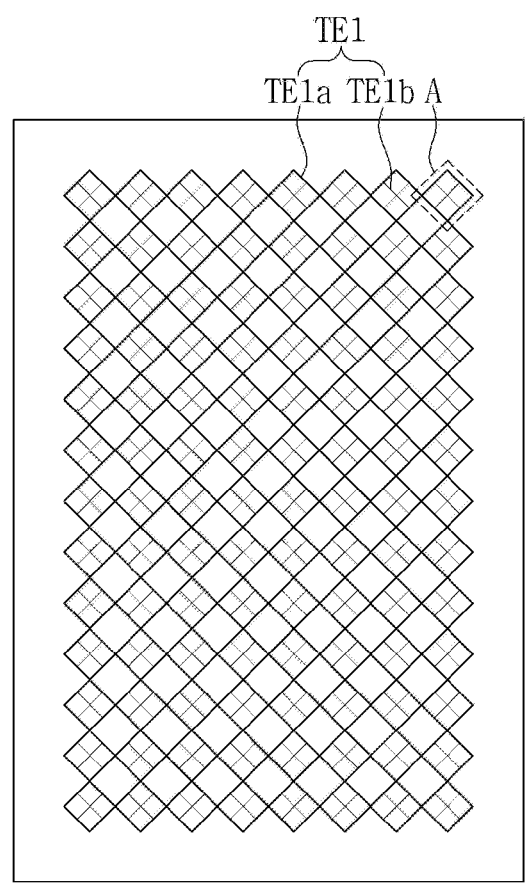
FIG. 4A is a plan view illustrating a first touch electrode according to an embodiment of the present inventive concept.
Figure 4B:
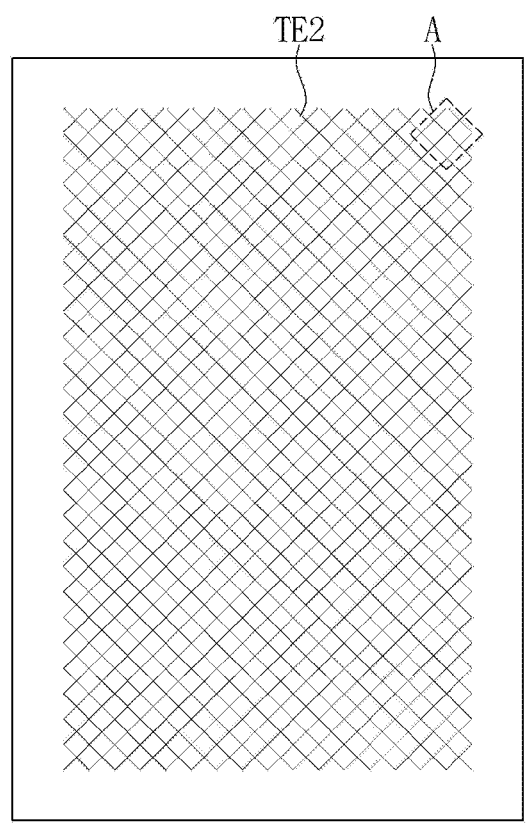
FIG. 4B is a plan view illustrating a second touch electrode according to an embodiment of the present inventive concept.
Figure 5:
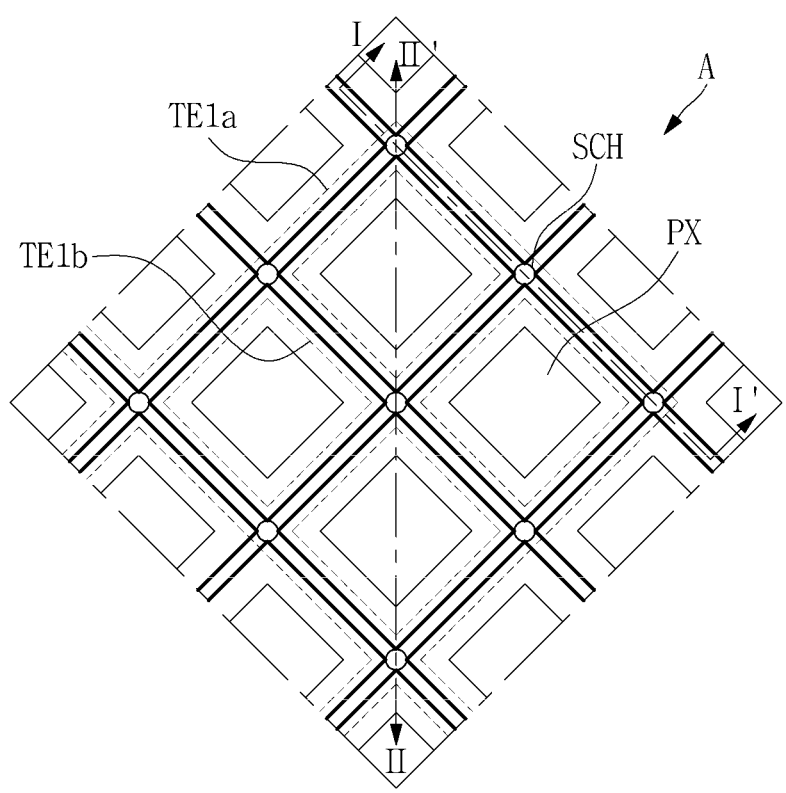
FIG. 5 is a view enlarging a portion A in FIGS. 4A and 4B.
Figure 6:
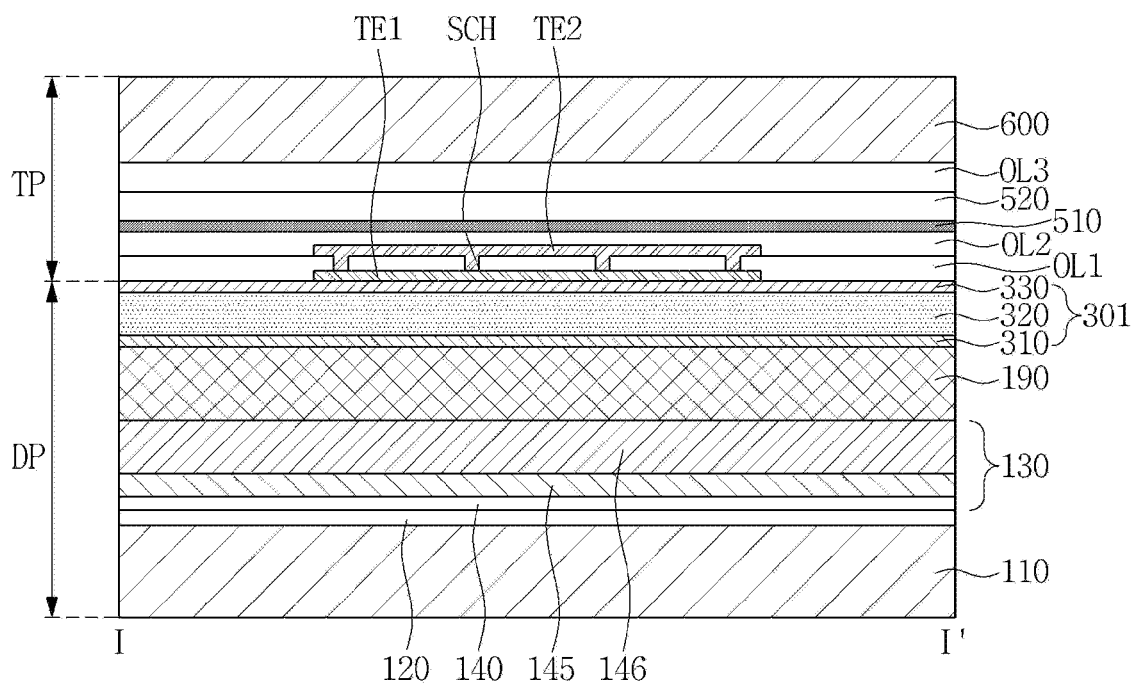
FIG. 6 is a cross-sectional view taken along line I-I' of FIG. 5.
Figure 7:
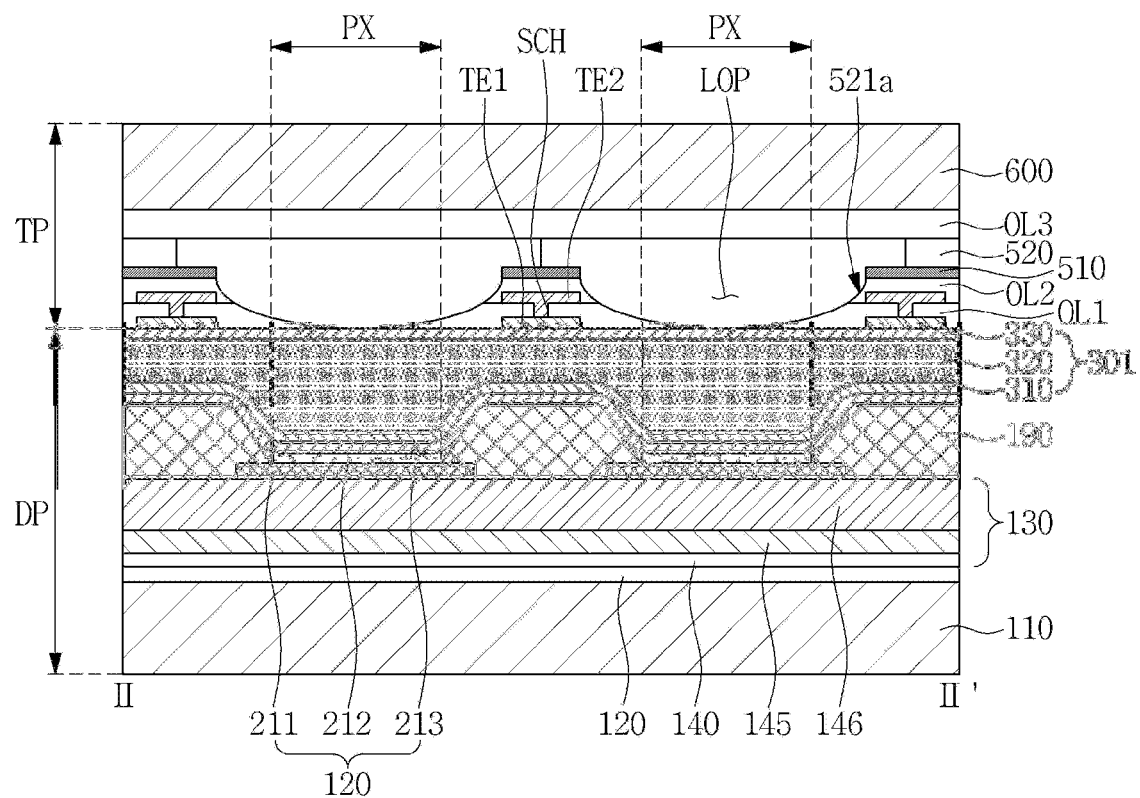
FIG. 7 is a cross-sectional view taken along line II-II' of FIG. 5.
Figure 8:
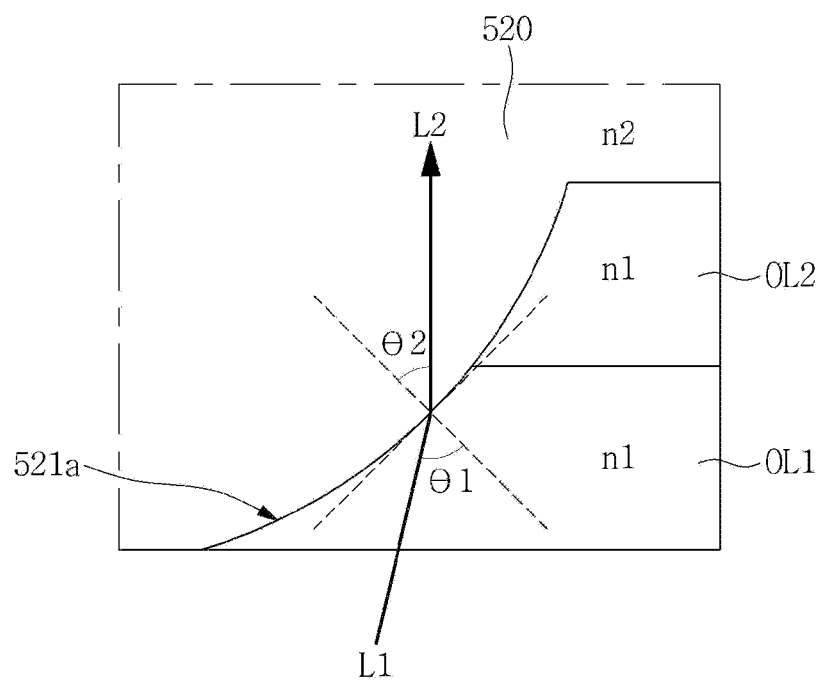
FIG. 8 is a cross-sectional view showing a path of a light in a first organic layer, a second organic layer, and a high refractive index layer.

FIG. 4A is a plan view illustrating a first touch electrode according to an embodiment of the present inventive concept, FIG. 4B is a plan view illustrating a second touch electrode according to an embodiment of the present inventive concept, FIG. 5 is a view enlarging a portion A in FIGS. 4A and 4B, FIG. 6 is a cross-sectional view taken along line I-I' of FIG. 5, FIG. 7 is a cross-sectional view taken along line II-II' of FIG. 5, and FIG. 8 is a cross-sectional view showing a path of a light in a first organic layer, a second organic layer, and a high refractive index layer.

Referring to FIGS. 4A to 7, the touch portion TP includes a first touch electrode TE1, a first organic layer OL1, a second touch electrode TE2, a second organic layer OL2, a light blocking portion 510, a high refractive index layer 520, a third organic layer OL3, and a second substrate 600.

Referring to FIGS. 1, 4A and 4B, the touch electrode TE may include the first touch electrode TE1 and the second touch electrode TE2.

The first touch electrode TE1 and the second touch electrode TE2 are disposed at an area corresponding to the display area DA. Although not illustrated, the first touch electrode TE1 and the second touch electrode TE2 may be connected to a touch driver by a connection line disposed at an area corresponding to the non-display area NDA.

The first touch electrode TE1 and the second touch electrode TE2 are disposed at an area where the pixel PX is not located. That is, the first touch electrode TE1 and the second touch electrode TE2 overlap the pixel defining layer 190.

The first touch electrode TE1 includes a first stem electrode TE1a and a first branch electrode TE1b.

The first stem electrode TE1a may have a plurality of quadrangular shapes in a plan view, and the first branch electrode TE1b may extend from at least one of the first stem electrodes TE1a to have a mesh shape in the quadrangular shape. Alternatively, the first branch electrode TE1b may not extend from at least one of the quadrangular shapes defined by the first stem electrodes TE1a. However, the shape of the first touch electrode TE1 is not limited thereto, and may take various forms.

The second touch electrode TE2 may have a mesh structure in a plan view. However, the embodiments are not limited thereto, and the second touch electrode TE2 may take various forms.

The first touch electrode TE1 overlaps the second touch electrode TE2. However, embodiments are not limited thereto.

It is illustrated in FIG. 5 that the first touch electrodes TE1a and TE1b have a width different from a width of the second touch electrode TE2 in a plan view. However, embodiments are not limited thereto, and the first touch electrodes TE1a and TE1b may have a width substantially equal to a width of the second touch electrode TE2 in a plan view.

The first organic layer OL1 is disposed on the first touch electrode TE1, and has a contact hole SCH for connecting the first touch electrode TE1 and the second touch electrode TE2. The second touch electrode TE2 is connected to the first touch electrode TE1 through the contact hole SCH.

The second organic layer OL2 is disposed on the second touch electrode TE2.

The second organic layer OL2 may have a refractive index substantially equal to a refractive index of the first organic layer OL1.

Referring to FIG. 7, the first organic layer OL1 and the second organic layer OL2 have a concave lens-shaped opening LOP at an area overlapping the pixel PX. For example, the openings LOP of the first organic layer OL1 and the second organic layer OL2 may overlap the first pixel electrode 211, the light emitting layer 212, and the second pixel electrode 213. In particular, the openings LOP of the first organic layer OL1 and the second organic layer OL2 may overlap the light emitting layer 212. In other words, the openings LOP of the first organic layer OL1 and the second organic layer OL2 may be located between the thin film encapsulation layer 301 and the light blocking layer 510. Thus, the openings LOP of the first organic layer OL1 and the second organic layer OL2 may also be disposed between the first touch electrode TE1 and the second touch electrode TE2.

The first organic layer OL1 and the second organic layer OL2 may have a refractive index less than a refractive index of the high refractive index layer 520 to be described below. For example, the first organic layer OL1 and the second organic layer OL2 may have a refractive index less than about 1.6.

The first organic layer OL1 and the second organic layer OL2 include a polymer-based material. The polymer-based material may include one of an acrylic resin, an epoxy resin, polyimide, and polyethylene. The first organic layer OL1 and the second organic layer OL2 may be formed on the thin film encapsulation layer 301 through a thermal deposition process and a patterning process. However, embodiments are not limited thereto, and the first organic layer OL1 and the second organic layer OL2 may be formed through various methods known to those skilled in the art.

The light blocking portion 510 is disposed on the second organic layer OL2, and overlaps the pixel defining layer 190. For example, the light blocking portion 510 is disposed on the first touch electrode TE1 and the second touch electrode TE2. The light blocking portion 510 may block light at an area where the pixel PX is not disposed, and may substantially prevent light reflected by the first touch electrode TE1 and the second touch electrode TE2 from being viewed.

The high refractive index layer 520 may overlap the pixel PX in a plan view. For example, the high refractive index layer 520 overlaps the light emitting layer 212 completely.

The high refractive index layer 520 is disposed at the lens-shaped opening LOP of the first organic layer OL1 and the second organic layer OL2. Accordingly, the high refractive index layer 520 may be disposed between the thin film encapsulation layer 301 and the third organic layer OL3, thus, may also be disposed between the first touch electrode TE1 and the second touch electrode TE2, and may include a first convex surface 521a protruding toward the display portion DP. The high refractive index layer 520 contacts at least one of the first organic layer OL1 and the second organic layer OL2.

The high refractive index layer 520 may have a refractive index higher than a refractive index of the first, second, and third organic layers OL1, OL2 and OL3. For example, the high refractive index layer 520 may have a refractive index of about 1.6, and the first, second, and third organic layers OL1, OL2, and OL3 may have a refractive index of about 1.5.

Accordingly, a light incident to an interface between the high refractive index layer 520 and the first and second organic layers OL1 and OL2 is refracted, which will be described below in detail with reference to FIG. 8.

The high refractive index layer 520 may be a color filter. For example, the high refractive index layer 520 may be a color filter of a color substantially the same as a color of a light emitted from the light emitting layer 212 overlapping the high refractive index layer 520. For example, a red light may be emitted from the light emitting layer 212, and the high refractive index layer 520 overlapping the light emitting layer 212 may be a red color filter. The light emitting layer 212 may emit a light having any color of red, green, and blue, and the high refractive index layer 520 may be a color filter having any color of red, green, and blue.

The third organic layer OL3 is disposed on the high refractive index layer 520. The third organic layer OL3 includes an insulating material and protects the first touch electrode TE1 and the second touch electrode TE2. The third organic layer OL3 may include a material substantially the same as a material included in the planarizing layer 146 and the insulating interlayer 145. The third organic layer OL3 serves to substantially prevent unnecessary components such as impurities or moisture from penetrating into the first and second touch electrodes TE1 and TE2 and to planarize the surface.

The third organic layer OL3 may have a refractive index substantially equal to a refractive index of the first organic layer OL1 and the second organic layer OL2. Accordingly, the third organic layer OL3 may have a refractive index less than that of the high refractive index layer 520.

The second substrate 600 is disposed on the third organic layer OL3. The second substrate 600 opposes the first substrate 110 and protects the first and second touch electrodes TE1 and TE2. As the second substrate 600, a transparent insulating substrate including glass, quartz, ceramics, plastic, or the like may be used. The second substrate 600 may be omitted. When the second substrate 600 is omitted, the flexible properties of the display device may become excellent.

Although not illustrated, an adhesive layer may be disposed between the second substrate 600 and the third organic layer OL3 to attach the second substrate 600 onto the third organic layer OL3.

FIG. 8 is a cross-sectional view showing a path of a light in a first organic layer OL1, a second organic layer OL2, and a high refractive index layer 520.

A light L1 generated in the light emitting layer 212 and incident to the first organic layer OL1 or the second organic layer OL2 is refracted at an interface between the high refractive layer 520 and the first and second organic layers OL1 and OL2. Referring to FIG. 8, the light L1 is incident to the interface between the high refractive layer 520 and the first and second organic layers OL1 and OL2 at an angle $\theta1$ (incidence angle), and is refracted at an angle $\theta2$ (refraction angle). In such an embodiment, a refractive index n2 of the high refractive index layer 520 is higher than a refractive index n1 of the first organic layer OL1 and the second organic layer OL2 (n2>n1), thus resulting in "$\theta2<\theta1$." Accordingly, the light L2 incident to the high refractive index layer 520 is in a state of being condensed toward the front as compared with the light L1 incident to the first organic layer OL1 or the second organic layer OL2.

As such, since the high refractive index layer 520 including the first convex surface 521a serves to condense light, the front visibility and luminous efficiency of the display device 101 are improved.

Hereinafter, another embodiment of the present inventive concept will be described with reference to FIG. 9.

Figure 9:
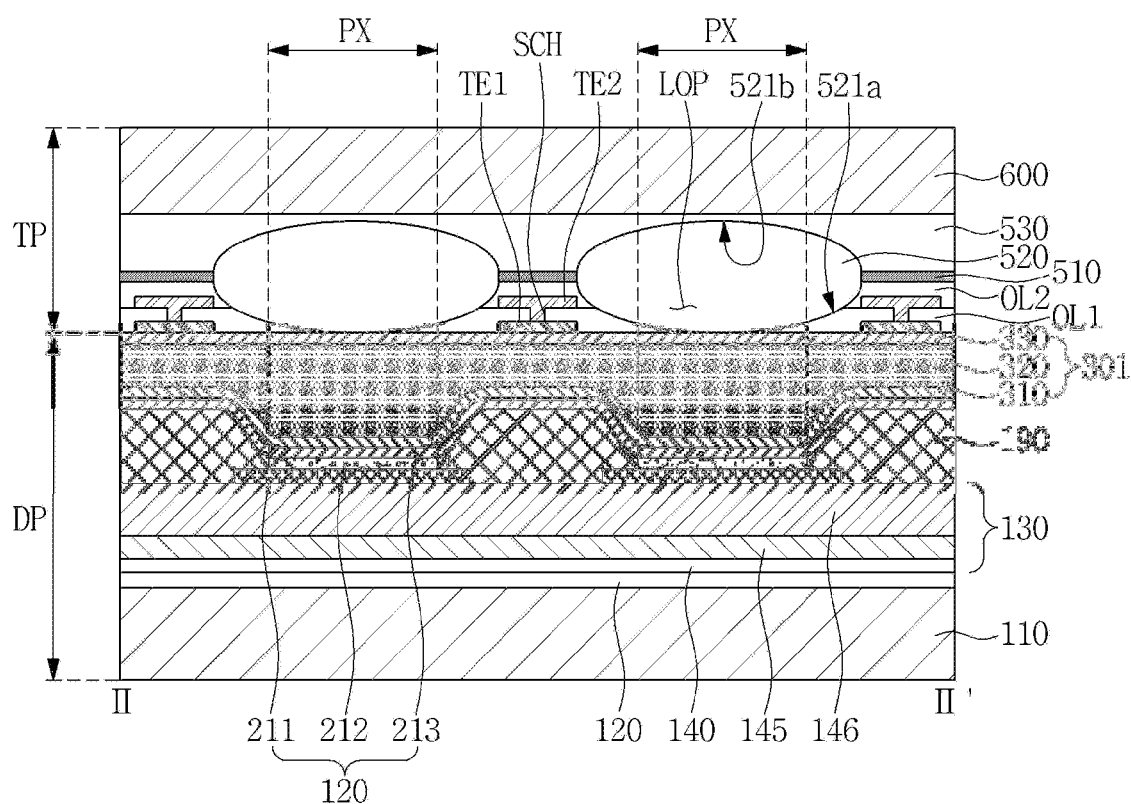
FIG. 9 is a cross-sectional view according to another embodiment of the present inventive concept.

FIG. 9 is a cross-sectional view according to another embodiment of the present inventive concept. Hereinafter, in order to avoid redundancy, a description of the components already described hereinabove will be omitted.

The high refractive index layer 520 may overlap the pixel PX in a plan view. For example, the high refractive index layer 520 overlaps the light emitting layer 212, and may be disposed between the first touch electrode TE1 and the second touch electrode TE2.

The high refractive index layer 520 is disposed at the lens-shaped opening LOP of the first organic layer OL1 and the second organic layer OL2. Accordingly, the high refractive index layer 520 may include the first convex surface 521a protruding toward the display portion DP. According to another embodiment of the present inventive concept, the high refractive index layer 520 may include a second convex surface 521b protruding toward the third organic layer OL3. Accordingly, the second convex surface 521b may be disposed between the light blocking portion and the third organic layer OL3.

The first convex surface 521a and the second convex surface 521b may overlap the pixel PX in a plan view. For example, the first convex surface 521a and the second convex surface 521b may overlap the light emitting layer 212. The second convex surface 521b may overlap the first convex surface 521a in a plan view.

The high refractive index layer 520 contacts at least one of the first organic layer OL1 and the second organic layer OL2 at an area overlapping the pixel PX. For example, the first convex surface 521a contacts at least one of the first organic layer OL1 and the second organic layer OL2.

The high refractive index layer 520 contacts the third organic layer OL3 at an area overlapping the pixel PX. For example, the second convex surface 521b may overlap the third organic layer OL3.

The high refractive index layer 520 may have a refractive index higher than a refractive index of the first, second, and third organic layers OL1, OL2 and OL3. For example, the high refractive index layer 520 may have a refractive index of about 1.6, and the first, second, and third organic layers OL1, OL2, and OL3 may have a refractive index of about 1.5.

According to another embodiment of the present inventive concept, a light generated in the light emitting layer 212 is refracted at an interface between the high refractive layer 520 and the first and second organic layers OL1 and OL2 and at an interface between the high refractive layer 520 and the third organic layer OL3 due to the first and second convex surfaces 521a and 521b having a lens shape and a refractive index difference between the high refractive layer 520 and the first, second, and third organic layers OL1, OL2 and OL3. As such, since the high refractive index layer 520 including the first and second convex surfaces 521a and 521b serves to condense light, the front visibility and luminous efficiency of the display device are improved.

Hereinafter, still another embodiment of the present inventive concept will be described with reference to FIG. 10.

Figure 10:
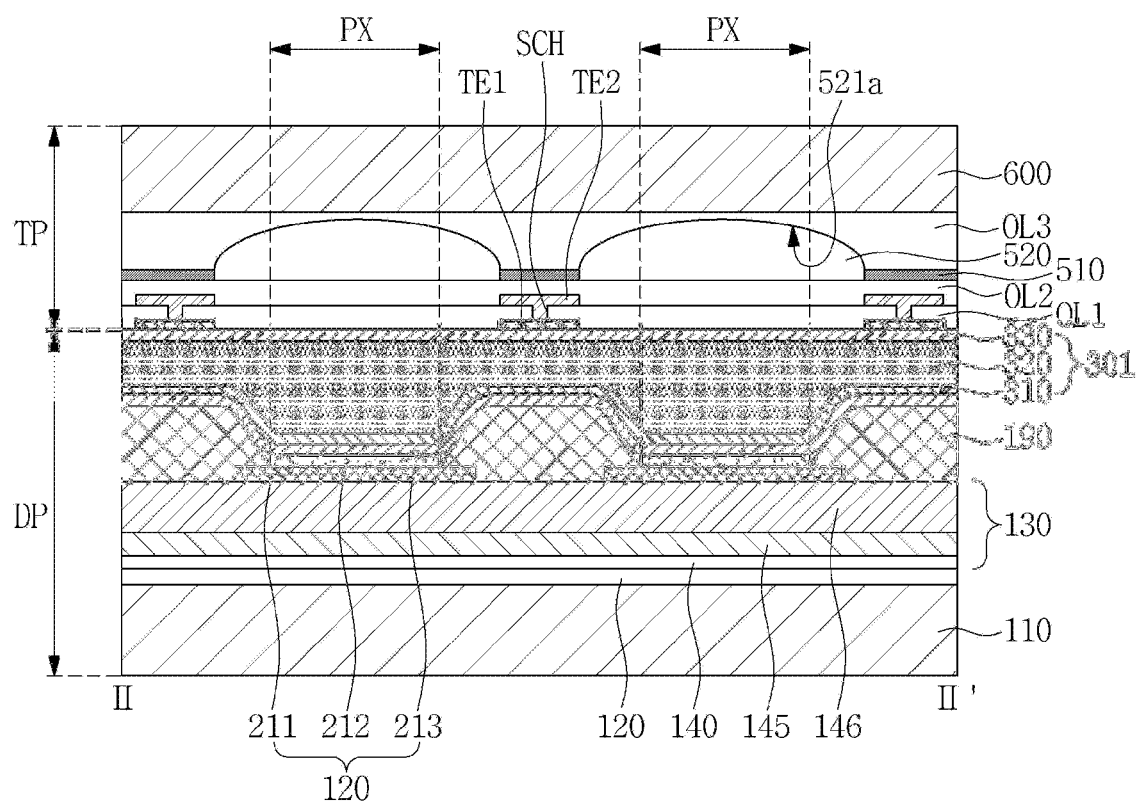
FIG. 10 is a cross-sectional view according to still another embodiment of the present inventive concept.

FIG. 10 is a cross-sectional view according to still another embodiment of the present inventive concept. Hereinafter, in order to avoid redundancy, a description of the components already described hereinabove will be omitted.

The high refractive index layer 520 may overlap the pixel PX in a plan view. For example, the high refractive index layer 520 overlaps the light emitting layer 212, and may be disposed between the second organic layer OL2 and the third organic layer OL3.

According to still another embodiment, the high refractive index layer 520 may include the first convex surface 521a protruding toward the third organic layer OL3.

The first convex surface 521a may overlap the pixel PX in a plan view. For example, the first convex surface 521a may overlap the light emitting layer 212 completely. In other words, the first convex surface 521a may be disposed between the second organic layer OL2 and the third organic layer OL3.

The high refractive index layer 520 contacts the third organic layer OL3 at an area overlapping the pixel PX. For example, the first convex surface 521a may overlap the third organic layer OL3.

The high refractive index layer 520 may have a refractive index higher than a refractive index of the first, second, and third organic layers OL1, OL2 and OL3. For example, the high refractive index layer 520 may have a refractive index of about 1.6, and the first, second, and third organic layers OL1, OL2, and OL3 may have a refractive index of about 1.5.

According to still another embodiment of the present inventive concept, a light generated in the light emitting layer 212 is refracted at an interface between the high refractive layer 520 and the third organic layer OL3 due to the first convex surface 521a having a lens shape and a refractive index difference between the high refractive layer 520 and the third organic layer OL3. As such, since the high refractive index layer 520 including the first convex surface 521a serves to condense light, the front visibility and luminous efficiency of the display device are improved.

Hereinafter, still another embodiment of the present inventive concept will be described with reference to FIG. 11.

Figure 11:
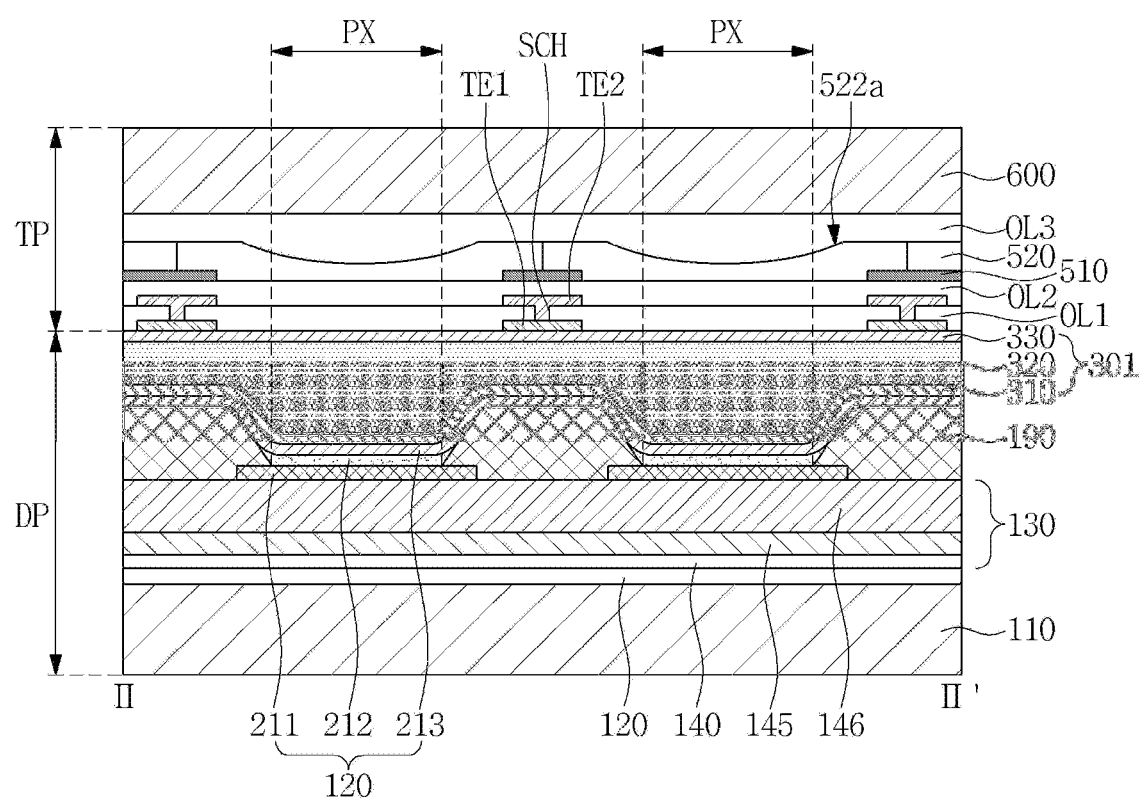
FIG. 11 is a cross-sectional view according to still another embodiment of the present inventive concept.

FIG. 11 is a cross-sectional view according to still another embodiment of the present inventive concept. Hereinafter, in order to avoid redundancy, a description of the components already described hereinabove will be omitted.

The high refractive index layer 520 may overlap the pixel PX in a plan view. For example, the high refractive index layer 520 overlaps the light emitting layer 212, and may be disposed between the second organic layer OL2 and the third organic layer OL3.

The high refractive index layer 520 may include a first concave surface 522a having a lens shape.

The first concave surface 522a may overlap the pixel PX in a plan view. For example, the first concave surface 522a may overlap the light emitting layer 212. In other words, the first concave surface 522a may be disposed between the high refractive index layer 520 and the third organic layer OL3.

The high refractive index layer 520 contacts the third organic layer OL3 at an area overlapping the pixel PX. For example, the first concave surface 522a may overlap the third organic layer OL3.

The high refractive index layer 520 may have a refractive index higher than a refractive index of the first, second, and third organic layers OL1, OL2 and OL3. For example, the high refractive index layer 520 may have a refractive index of about 1.6, and the first, second, and third organic layers OL1, OL2, and OL3 may have a refractive index of about 1.5.

According to still another embodiment of the present inventive concept, a light generated in the light emitting layer 212 is refracted at an interface between the high refractive layer 520 and the third organic layer OL3 due to the first concave surface 522a having a lens shape and a refractive index difference between the high refractive layer 520 and the third organic layer OL3. As such, since the high refractive index layer 520 including the first concave surface 522a serves to condense light, the front visibility and luminous efficiency of the display device are improved.

As set forth hereinabove, according to one or more embodiments, the display device has excellent luminous efficiency.

While the present inventive concept has been illustrated and described with reference to the embodiments thereof, it will be apparent to those of ordinary skill in the art that various changes in form and detail may be formed thereto without departing from the spirit and scope of the present inventive concept.

What is claimed is:

1. A display device comprising:
   a display portion comprising pixels defined by a pixel defining layer; and
   a touch portion on the display portion,
   wherein the touch portion comprises:
   a first touch electrode overlapping the pixel defining layer;
   a first organic layer on the first touch electrode;
   a second touch electrode contacting the first touch electrode;
   a second organic layer on the second touch electrode; and
   a high refractive index layer on the first organic layer, the second touch electrode, and the second organic layer, and
   wherein the high refractive index layer is disposed between adjacent second touch electrodes in a plan view and comprises a first convex surface protruding toward the display portion and overlapping one of the pixels.

2. The display device of claim 1, wherein the first organic layer has a refractive index substantially equal to a refractive index of the second organic layer, and
   wherein the high refractive index layer has a refractive index higher than a refractive index of the first organic layer.

3. The display device of claim 1, wherein the first convex surface contacts at least one of the first organic layer and the second organic layer.

4. The display device of claim 1, wherein the touch portion further comprises a third organic layer disposed on the high refractive index layer and having a refractive index substantially equal to a refractive index of the first organic layer and the second organic layer.

5. The display device of claim 4, wherein the high refractive index layer is disposed between the second touch electrodes in a plan view and comprises a second convex surface protruding toward the third organic layer.

6. The display device of claim 5, wherein the second convex surface contacts the third organic layer.

7. The display device of claim 5, wherein the second convex surface overlaps the first convex surface in a plan view.

8. The display device of claim 5, wherein the touch portion further comprises a substrate and an adhesive layer, the adhesive layer being disposed between the substrate and the third organic layer.

9. The display device of claim 1, wherein the display portion comprises:
 a first pixel electrode;
 a light emitting layer on the first pixel electrode; and
 a second pixel electrode on the light emitting layer.

10. The display device of claim 9, wherein the high refractive index layer is a color filter having a color substantially the same as a color of a light emitted from the light emitting layer.

11. The display device of claim 10, wherein the high refractive index layer is a color filter having one color of red, green, and blue.

12. The display device of claim 9, wherein the first convex surface of the high refractive index layer overlaps the light emitting layer.

13. The display device of claim 9, wherein the first touch electrode and the second touch electrode overlap the pixel defining layer.

14. The display device of claim 9, wherein the touch portion further comprises a light blocking portion on the second organic layer, the light blocking portion overlapping the pixel defining layer.

15. The display device of claim 9, wherein the display portion further comprises a thin film encapsulation layer on the second pixel electrode and the pixel defining layer.

16. The display device of claim 15, wherein the display portion further comprises an inorganic layer between the touch portion and the thin film encapsulation layer.

17. A display device comprising:
 a display portion comprising a pixel area defined by a plurality of pixel defining layers; and
 a touch portion on the display portion,
 wherein the touch portion comprises:
 a first touch electrode overlapping the pixel defining layer;
 a first organic layer on the first touch electrode;
 a second touch electrode on the first organic layer;
 a second organic layer on the second touch electrode;
 a high refractive index layer on the first organic layer, the second touch electrode, and the second organic layer; and
 a third organic layer disposed on the high refractive index layer and having a refractive index substantially equal to a refractive index of the first organic layer and the second organic layer,
 wherein the high refractive index layer is disposed between adjacent second touch electrodes in a plan view and comprises a first convex surface protruding toward the third organic layer and overlapping the pixel area, and
 wherein the high refractive index layer has a refractive index higher than a refractive index of the first, second, and third organic layers.

18. The display device of claim 17, wherein the first convex surface contacts the third organic layer.

19. A display device comprising:
 a display portion comprising a pixel area defined by a plurality of pixel defining layers; and
 a touch portion on the display portion,
 wherein the touch portion comprises:
 a first touch electrode overlapping the pixel defining layer;
 a first organic layer on the first touch electrode;
 a second touch electrode on the first organic layer;
 a second organic layer on the second touch electrode;
 a high refractive index layer on the first organic layer, the second touch electrode, and the second organic layer; and
 a third organic layer on the high refractive index layer,
 wherein the high refractive index layer is disposed between adjacent second touch electrodes in a plan view and comprises a first concave surface having a lens shape and overlapping the pixel area, and
 wherein the high refractive index layer has a refractive index higher than a refractive index of the first, second, and third organic layers.

20. The display device of claim 19, wherein the first concave surface contacts the third organic layer.

* * * * *